United States Patent [19]
Kawata

[11] Patent Number: 6,078,106
[45] Date of Patent: Jun. 20, 2000

[54] SEMICONDUCTOR MEMORY DEVICE HAVING A PLURALITY OF WIRING LAYERS

[75] Inventor: Masato Kawata, Tokyo, Japan

[73] Assignee: NEC Corporation, Tokyo, Japan

[21] Appl. No.: 09/359,388

[22] Filed: Jul. 23, 1999

[30] Foreign Application Priority Data

Jul. 24, 1998 [JP] Japan .................................. 10-208835

[51] Int. Cl.[7] ........................... H01L 23/52; H01L 29/40; H01L 23/48
[52] U.S. Cl. .......................... 257/758; 257/760; 257/296; 257/306; 438/253; 438/396; 438/622; 438/625
[58] Field of Search .................................. 438/118, 211, 438/253, 396, 622, 623, 624, 625, 626; 275/203, 207, 208, 211, 296, 306, 310, 401, 752, 758, 760, 759, 774

[56] References Cited

U.S. PATENT DOCUMENTS

| | | | |
|---|---|---|---|
| 4,617,193 | 10/1986 | Wu | 438/631 |
| 5,060,045 | 10/1991 | Owada et al. | 257/211 |
| 5,432,732 | 7/1995 | Ohmi | 365/149 |
| 5,670,409 | 9/1997 | Otori et al. | 438/211 |
| 5,689,126 | 11/1997 | Takaishi | 257/306 |
| 5,811,849 | 9/1998 | Matsuura | 257/306 |
| 5,907,788 | 5/1999 | Kasai | 438/622 |
| 5,990,507 | 11/1999 | Mochizuki et al. | 257/295 |

*Primary Examiner*—Donald L. Monin, Jr.
*Assistant Examiner*—Hoai Pham
*Attorney, Agent, or Firm*—McGinn & Gibb, P.C.

[57] ABSTRACT

A semiconductor memory device, which has metal wirings on interlayer insulating films having a step on a border portion between a memory cell array region and a peripheral circuit region, and which can prevent a short-circuit between adjacent metal wirings to allow a cell area thereof to be reduced, is provided. No metal wiring is provided on a first interlayer insulating film formed on the border portion and having a large step. Connecting wirings are provided on a second interlayer insulating film formed on the border portion and having a small step to connect metal wirings of a first metal wiring layer.

15 Claims, 7 Drawing Sheets

PRIOR ART

Fig. 6

PRIOR ART

Fig. 7

PRIOR ART

SEMICONDUCTOR MEMORY DEVICE HAVING A PLURALITY OF WIRING LAYERS

BACKGROUND OF THE INVENTION

1. Field of the Invention

The present invention relates to a semiconductor memory device and, particularly, to a structure of wiring layers of a semiconductor memory device, which has at least two metal wiring layers.

2. Description of the Related Art

Figure 5:
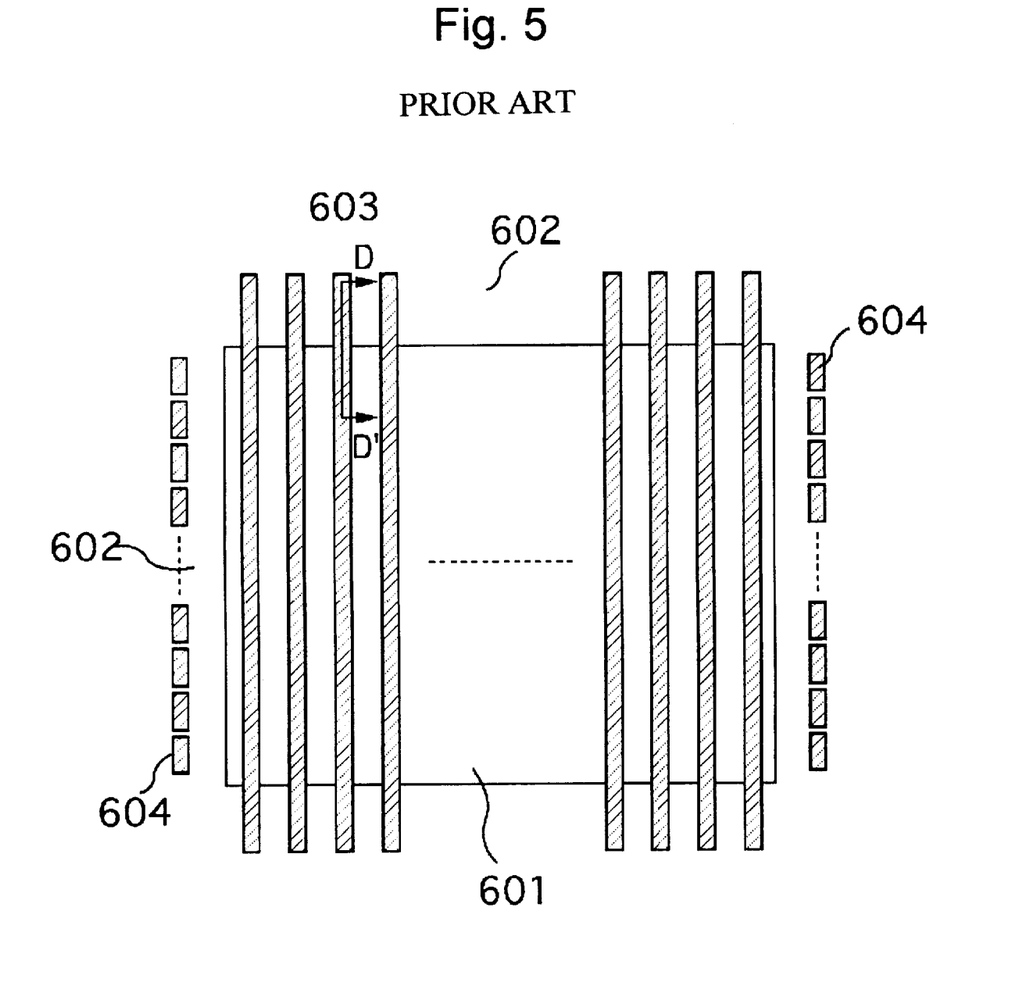
FIG. 5 is a plan view of a first wiring layer of a conventional flash memory.
Figure 6:
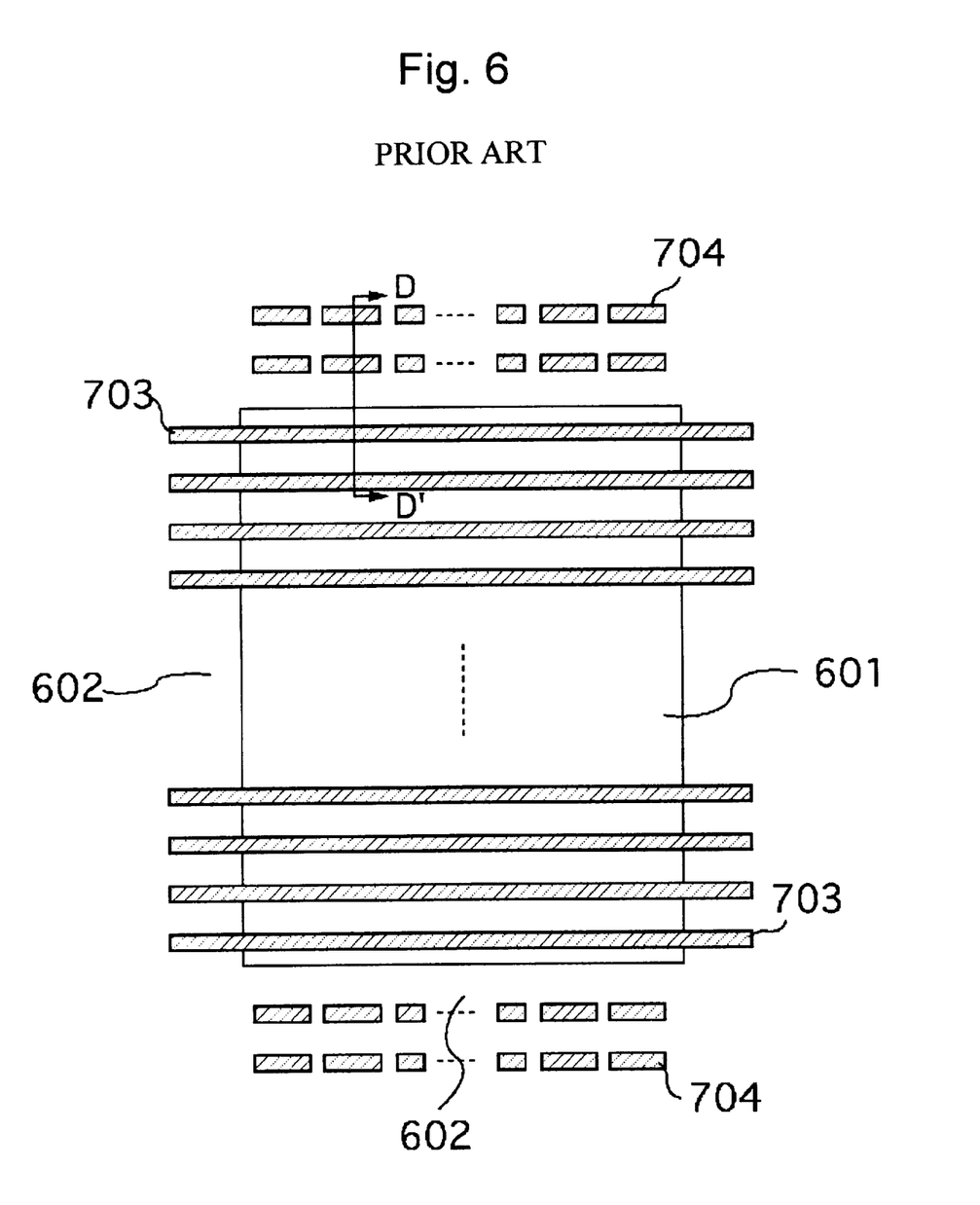
FIG. 6 is a plan view of a second wiring layer of the conventional flash memory.
Figure 7:
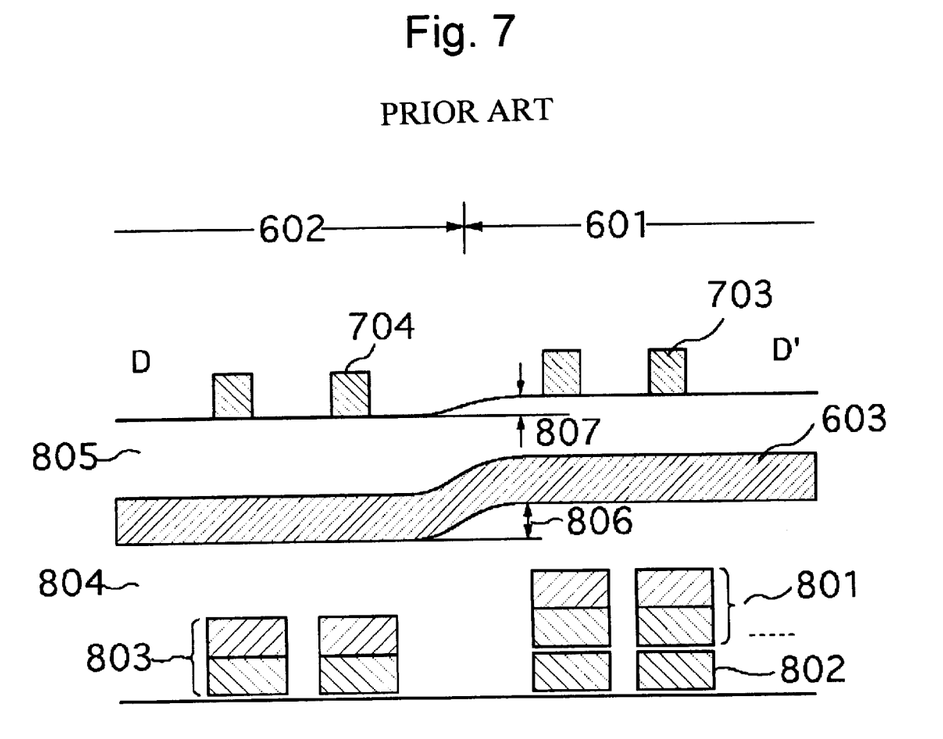
FIG. 7 is a cross section taken along a line D–D' in FIGS. 5 and 6.

It is general that a flash memory has at least two metal wiring layers and that a wiring in each layer strides over an area between a memory cell array portion and a peripheral circuit portion to connect between them. FIGS. 5 to 7 show an example of such metal wiring layers of a conventional flash memory.

FIGS. 5 and 6 are plan views of a first metal wiring layer and a second metal wiring layer of the conventional flash memory, respectively. In these figures, a square area 601 is a memory cell array portion and a peripheral circuit portion is arranged in an area 602 surrounding the memory cell array portion 601. As shown in FIG. 5, the first metal wiring layer includes bit lines 603 and wirings 604 for the peripheral circuit portion 602. The bit lines 603 stride over a border area between the memory cell array portion 601 and the peripheral circuit portion 602. The second metal wiring layer includes wirings 703, which back word lines, and wirings 704 for the peripheral circuit portion 602, as shown in FIG. 6. The wirings 703 stride over the border area between the memory cell array portion 601 and the peripheral circuit portion 602 in a direction perpendicular to the direction of the bit lines 603 in the first metal wiring layer.

FIG. 7 is cross sections taken along a line D–D' in FIGS. 5 and 6 in an overlapped relation, showing a region in the vicinity of the border area between the memory cell array portion and the peripheral circuit portion. A flash memory having double layer gates is formed in the memory cell array portion 601. Reference numerals 801 and 802 depict a control gate and a floating gate of the flash memory, respectively. The control gate 801 has a polycide structure. A plurality of peripheral transistors each having a single layer gate are formed in the peripheral circuit portion 602. A reference numeral 803 depicts a gate electrode of each of the peripheral transistors. An interlayer insulating film 804 is formed on the gate electrode of each peripheral transistor and flattened by CMP (chemical-mechanical polishing), with a step 806 being left in the boarder portion between the memory cell array portion 601 and the peripheral circuit portion 602. The step 806 is caused by a difference in height between the flash memory cell having the double layer gates 801 and 802 and the peripheral transistor having the single layer gate 803 and such large step is usually left even when the interlayer insulating film is flattened by CMP. Since the bit lines 603 are formed on the interlayer insulating film 804 and stride over the border area between the memory cell array portion 601 and the peripheral circuit portion 602, the bit lines are also formed on the step 806. An interlayer insulating film 805 is further formed on the bit lines 603 and flattened by CMP similarly to the interlayer insulating film 804, with a step 807 being left in the boarder portion between the memory cell array portion 601 and the peripheral circuit portion 602. The wirings 703, which back word lines, and the wirings 704 for the peripheral circuit portion 602 are formed on the interlayer insulating film 805. The wirings 703 stride over the area between the memory cell array portion 601 and the peripheral circuit portion 602 in a cross section taken perpendicularly to that shown in FIG. 7 and is also formed on the step 807.

As described, in the flash memory, there are the steps 806 and 807 formed in the interlayer insulating films on the border portion due to the difference in height between the gates of the transistors of the memory cell array portion 601 and the gates of the transistors of the peripheral circuit portion 602 and, when CMP is performed to flatten the interlayer insulating films, the step 806 of, particularly, the first interlayer insulating film 804 becomes as large as 80 nm. Since, in the conventional technology, the wirings (bit lines 603) are formed on the border portion in which the large step 806 exists, there is a problem.

That is, the bit lines 603 are formed by forming a metal film of such as aluminum on a whole surface of the interlayer insulating film 804 and patterning the metal film by etching. In etching the metal film, a portion of the metal film tends to be left non-etched on the area in which there is the large step 806. When there is such metal film portion left non-etched on the area, there may be a possibility of short-circuit between adjacent wirings. Therefore, according to the conventional technology, a margin has to be provided in a distance between adjacent wirings, causing the distance to be about 0.5 $\mu$m or more. Consequently, it becomes difficult to reduce a cell area of the semiconductor memory device.

SUMMARY OF THE INVENTION

An object of the present invention is to provide a semiconductor memory device capable of preventing short-circuit between wirings and of reducing a cell area of the semiconductor memory device compared with that achievable by the conventional technology.

In order to achieve the above object, a semiconductor memory device according to the present invention, which includes a memory cell array portion, a peripheral circuit portion surrounding the memory cell array portion, both formed on a semiconductor substrate, and a plurality of interlayer insulating films, is featured by comprising a first insulating film formed on the memory cell array portion and the peripheral circuit portion and having a first step in a border area between the memory cell array portion and the peripheral circuit portion, a first wiring layer preferentially formed in a region of the first insulating film other than the border area and having first wirings in the memory cell array portion and second wirings in the peripheral circuit portion, a second insulating film formed on the first wiring layer and a second wiring layer preferentially formed on the second insulating film and having third wirings in the border area. The third wirings electrically connect the first wirings and the second wirings.

According to the construction of the present invention, the first wirings of the memory cell array portion and the second wirings of the peripheral circuit portion in the first wiring layer are electrically connected to each other through the third wirings in the second wiring layer, which is formed on the border portion of the second insulating film having a small step and there is no wiring provided on the first insulating film in the border portion between the memory cell array portion and the peripheral circuit portion, in which there is the large step. Therefore, it is possible to form the wiring in only a region in which a portion of the metal is hardly left non-etched. Consequently, a short-circuit between the adjacent wirings can be prevented. Due to the prevention of the short-circuit, it becomes possible to reduce the distance between the adjacent wirings to thereby reduce the cell area of the semiconductor memory device.

BRIEF DESCRIPTION OF THE DRAWINGS

The above and other objects, advantages and features of the present invention will become more apparent from the following description taken in conjunction with the accompanying drawings, in which.

DESCRIPTION OF THE PREFERRED EMBODIMENTS

Figure 1:
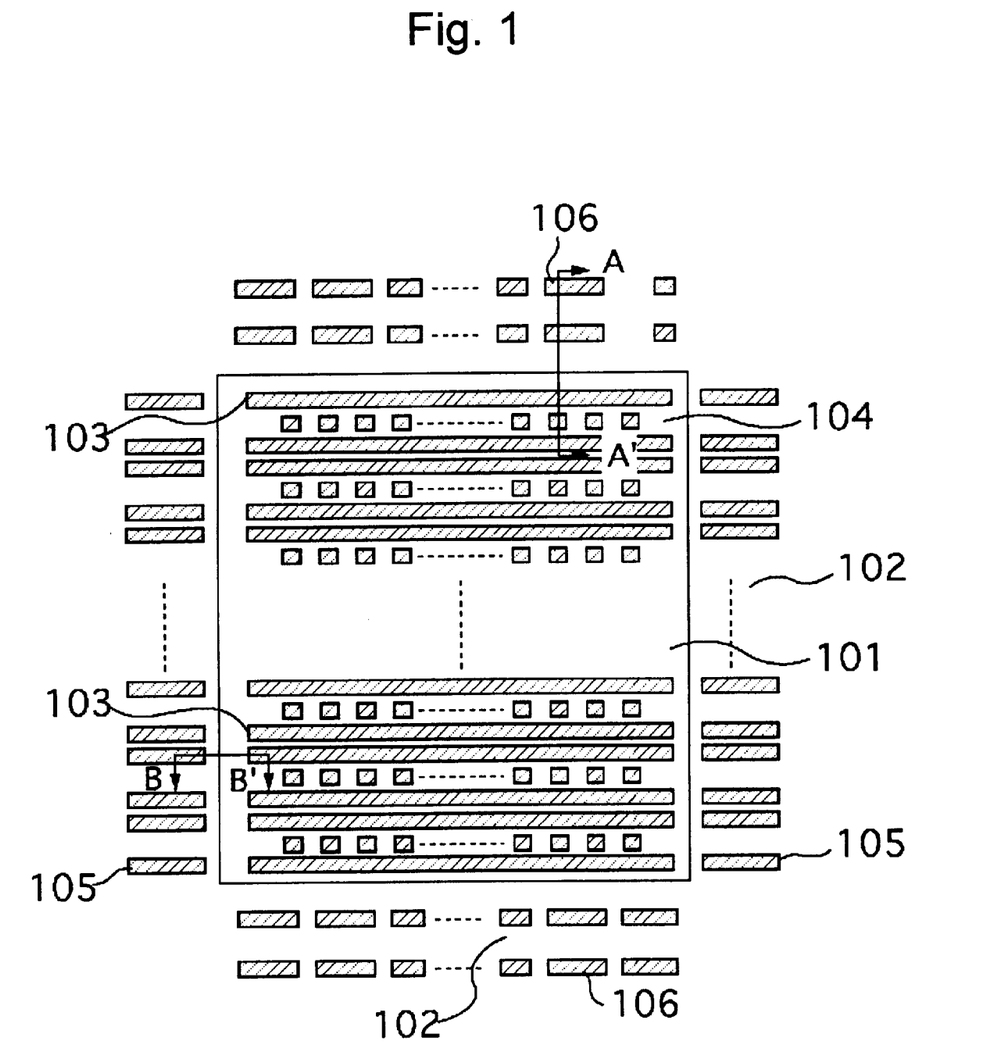
FIG. 1 is a plan view of a first wiring layer of a flash memory according to an embodiment of the present invention.
Figure 2:
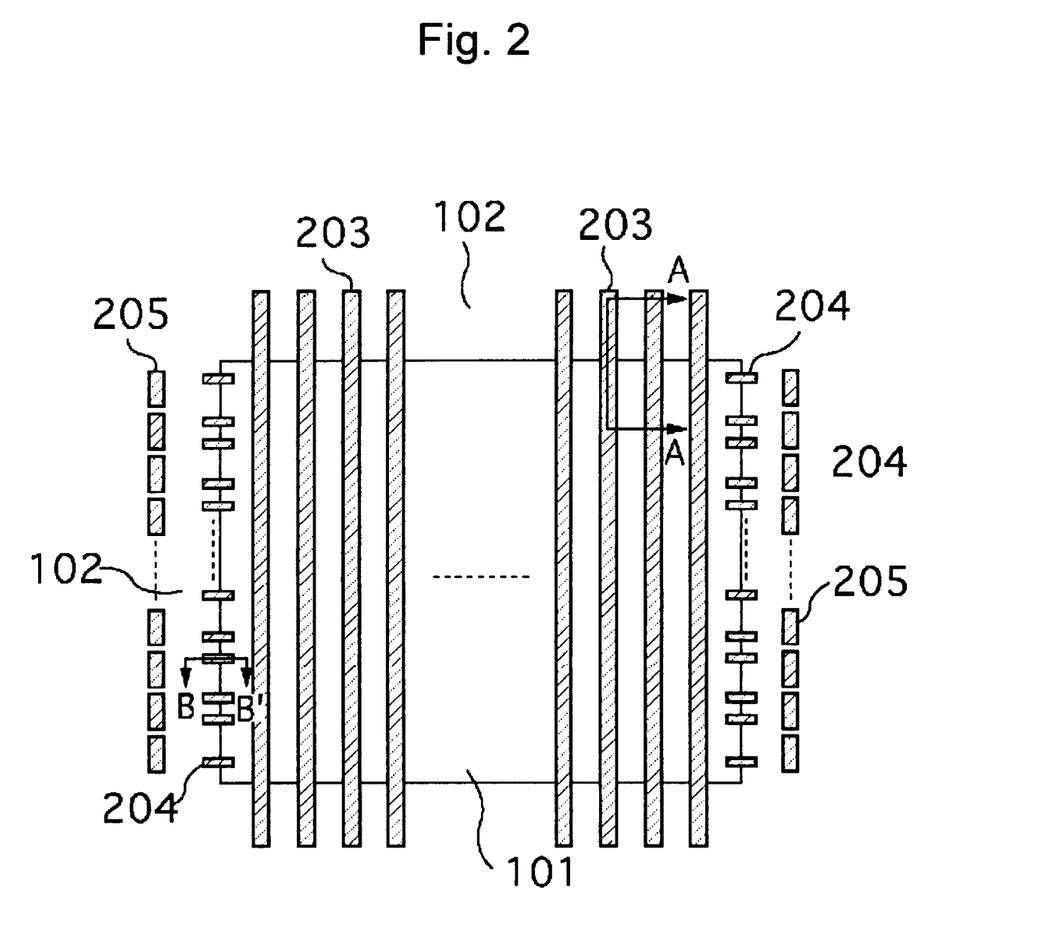
FIG. 2 is a plan view of a second wiring layer of a flash memory according to the embodiment of the present invention.

FIGS. 1 to 4 show a flash memory according to an embodiment of the present invention, in which FIGS. 1 and 2 are plan views of a first and second metal wiring layers of the flash memory, respectively. A square region 101 indicates a memory cell array portion and a region 102 surrounding the memory cell array portion indicates a peripheral circuit portion.

As shown in FIG. 1, no wiring of the first metal wiring layer is provided in a border portion between the memory cell array portion 101 and the peripheral circuit portion 102. In the memory cell array portion 101, wirings 103, which back word lines, and contact dots 104 for electrical connection between bit lines formed in the second wiring layer and diffusion layers of memory cell transistors. Incidentally, the wirings 103 backing the word lines are used in such situation that a high-speed operation of the semiconductor memory device is especially required. A case where a microcomputer and a flash memory device are mounted in a mixed state is a typical example of such situation. The purpose of provision of the wirings 103 is to provide a number of contacts with respect to control gate electrodes of the flash memory cells, that is, the word lines, with a constant interval to thereby reduce a delay of operation due to a wiring resistance. In this embodiment, the wirings 103 backing the word lines are formed in the first metal wiring layer. In the peripheral circuit portion 102, wirings 106 for peripheral circuits and wirings 105 electrically connected to the wirings 103 are formed. A gap between adjacent wirings 106 as well as adjacent wirings 105 is about 0.3 μm.

As shown in FIG. 2, in the second metal wiring layer, wirings are formed in the border area between the memory cell array portion 101 and the peripheral circuit portion 102. The bit lines 203 are arranged in such a way that the bit lines stride over the border portion in a direction perpendicular to the direction of the wirings 103 in the first metal wiring layer. On the border portion having no bit line formed thereon, wirings 204 for electrically connecting the wirings 103, which are formed within the memory cell array portion 101, and the wirings 105 for the peripheral circuit portion 102 of the first metal wiring layer are formed. Wirings 205 for the peripheral circuits are also formed in the peripheral circuit portion 102.

Figure 3:
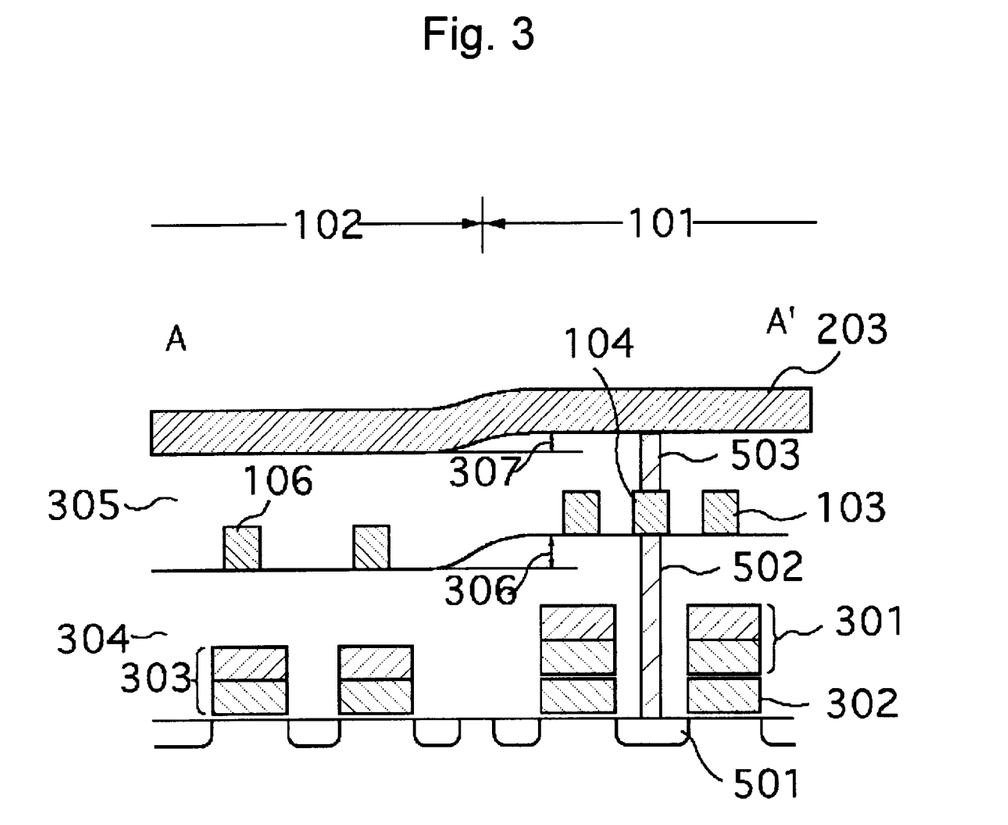
FIG. 3 is a cross section taken along a line A–A' in FIGS. 1 and 2.

FIG. 3 is a cross section taken along a line A–A' in FIGS. 1 and 2, showing a structure of a portion in the vicinity of the border portion between the memory cell array portion 101 and the peripheral circuit portion 102. The memory cell transistors each having a control gate (word line) 301 and a floating gate 302 are formed in the memory cell array portion 101 on the semiconductor substrate and the peripheral transistors each having a gate electrode 303 are formed in the peripheral circuit portion 102. Incidentally, each of the control gate 301 and the gate electrode 303 has a polycide structure including a phosphorus-doped polysilicon layer about 150 nm thick and a tungsten silicide layer about 150 nm thick formed on the phosphorus doped polysilicon layer. Further, the floating gate 302 is a phosphorus-doped polysilicon film about 150 nm thick. An interlayer insulating film 304 having thickness of about 800 nm is formed on the gate electrode. The interlayer insulating film is of BPSG (borophospho-silicate glass) and flattened by CMP. A portion of the interlayer insulating film 304, which corresponds to a border portion between the memory cell array portion 101 and the peripheral circuit portion 102, includes a step 306 about 80 nm high as in the device of the conventional technique When a wiring is formed on the large step 306 by etching a metal film, a portion of the wiring tends to be left non-etched. Particularly, when a gap between adjacent wirings becomes 0.5 μm or less, a short-circuit tends to occur between them. Therefore, the wirings 103, which back the word lines formed on the interlayer insulating film 304, are not formed on the border portion in which the step 306 exists. The first metal wiring layer, which includes the wirings 103, 105 and the contact dots 104, is composed of an aluminum layer about 450 nm thick sandwiched between TiN barrier metal films 30 nm and 50 nm thick (not shown). On the wirings 103, a silicon oxide interlayer insulating film 305 having thickness of about 400 nm and flattened by CMP is formed. A small step 307, which is about 30 nm high, exists in the interlayer insulating film 305 on the border portion. However, since it is so small that no portion of the wiring thereon is left non-etched, a short-circuit between adjacent wirings is prevented even when the gap therebetween becomes 0.3 μm. The second metal wiring layer, which includes the wirings 203, 204 and 205, is composed of an aluminum layer about 450 nm thick sandwiched between TiN barrier metal films 30 nm and 50 nm thick (not shown). Although the bit lines 203 of the second layer are formed also on the border portion, there is no short-circuit occurs even when the gap between the adjacent bit lines is about 0.3 μm since the step 307 is small as mentioned. Source-drain diffusion layers 501 of the memory cell transistors are electrically connected to the bit lines 203 of the second metal wiring layer by means of the contact dots 104. That is, contact-holes 502 are formed in the interlayer insulating film 304 on the source-drain diffusion layers 501 and filled with tungsten. The contact dots 104 formed on the interlayer insulating film 304 are connected to the source-drain diffusion layers 501 through the contact-holes 502. The contact dots 104 are further connected to bit lines 203 of the upper layer through via-holes 503 formed in the interlayer insulating film 305 on the interlayer insulating film 304.

Figure 4:
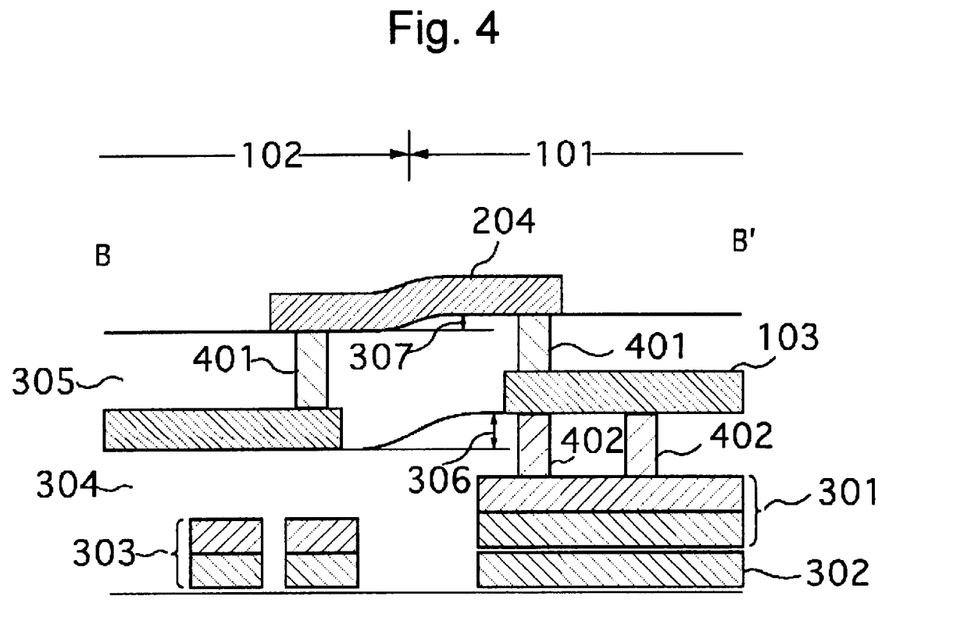
FIG. 4 is a cross section taken along a line B–B' in FIGS. 1 and 2.

FIG. 4 is a cross section taken along a line B–B' in FIGS. 1 and 2, showing a connecting portion between the wirings 103 in the memory cell array portion 101 and the wirings 105 of the peripheral circuit portion 102. Via-holes 401 filled with tungsten are formed in portions of the interlayer insulating film 305 on end portions of the wirings 103 and end portions of the wirings 105. The wirings 204 formed on the step of the interlayer insulating film 305 are electrically connected to the wirings 103 and 105 of the first layer by these via-holes 401, so that the wirings 103 are electrically connected to the wirings 105. Since the step 307 of the second interlayer insulating film 305 is small as mentioned previously, a short-circuit does not occur between adjacent wirings 204 formed on the border portion of the interlayer insulating film 305 even when the gap between the adjacent wirings 204 is as small as 0.3 $\mu$m. Further, the control gate electrodes (word lines) 301 are electrically connected to the wirings 103 backing the word lines, through tungsten filling the via-holes 402. Although only two via-holes 402 are shown in FIG. 4, the wirings 103 are connected to the control gates 301 through a number of via-holes 402 formed along a longitudinal direction thereof to prevent the wiring delay, as mentioned previously.

As such, in a case where a step about 80 nm high exists in the first interlayer insulating film, it is possible to realize a gap of about 0.3 $\mu$m between adjacent wirings according to the present invention, which is substantially smaller than the gap size of 0.5 $\mu$m or more required in the conventional technology. Therefore, it becomes possible to substantially reduce the cell area.

In this embodiment, the wirings backing the word lines are provided in the first metal wiring layer and the bit lines are provided in the second metal wiring layer. Alternatively, it may be possible to provide the bit lines in the first metal wiring layer and the wirings backing the word lines in the second metal wiring layer. It is general that, in order to prevent the wiring delay, it is necessary to connect the word lines to the wirings backing the word lines through the via-holes, the number of which should be as large as possible. In providing a larger number of via-holes, however, the described embodiment, in which the wirings backing the word lines are provided in the first metal wiring layer, is preferable.

It should be noted that the present invention is not limited to a semiconductor memory device having two layer metal wiring layers and can be applied to a semiconductor memory device having at least three metal wiring layers. In the latter case and when a first interlayer insulating film as well as a second interlayer insulating film has steps, whose heights are large enough to cause the problem of residual metal portion to occur when metal wiring layers are patterned by etching, no wiring of a second metal wiring layer is provided on a border portion between a memory cell array portion and a peripheral circuit portion. Instead thereof, wirings for connecting wirings in the memory cell array portions and wirings of the peripheral circuit portions of the first and second layers are provided on a portion of the third or subsequent interlayer insulating film having a small step.

Although, in the described embodiment, the present invention is applied to the semiconductor memory device having the flash memory cells, it should be noted that the present invention can be applied to a semiconductor memory device such as a DRAM having memory cells having a stacked capacitor structure, in which a large step is provided in a portion of an interlayer insulating film on a border portion between a memory cell array portion and a peripheral circuit portion thereof.

As described hereinbefore, in a semiconductor memory device according to the present invention, which has a memory cell array portion, a peripheral circuit portion surrounding the memory cell array portion and a plurality of interlayer insulating films having steps on a border portion between the memory cell array portion and the peripheral circuit portion, the present invention is featured by that no wiring is provided on the step portion of the interlayer insulating film, which is high enough to cause a portion of a wiring of a metal wiring layer to be left non-etched when the wiring is formed thereon by patterning the metal wiring layer by etching to thereby tend adjacent wirings to be short-circuited, and that wirings of the metal wiring layer, which are on both sides of the border portion and are to be connected electrically, are connected by using wirings provided on other interlayer insulating films in the border portion. Therefore, the possibility of leftovers of metal material when the wirings are formed by etching is reduced and the short-circuit between adjacent wirings can be prevented. With the prevention of short-circuit, it becomes possible to reduce the gap between adjacent wirings and, therefore, it is possible to reduce the cell area, resulting in a semiconductor memory device having reduced area.

It is apparent that the present invention is not limited to the above embodiments, but may be modified and changed without departing from the scope and spirit of the present invention.

What is claimed is:

1. A semiconductor memory device comprising:
    a first insulating layer having a first step on a border portion between a first region and a second region;
    a first wiring layer formed on a region other than said border portion on said first and second region;
    a second insulating layer having a second step, which is lower than said first step, and covering said first wiring layer; and
    a second wiring layer formed on said second step of said second insulating layer and electrically connecting a portion of said first wiring layer in said first region to a portion of said first wiring layer in said second region.

2. The semiconductor memory device as claimed in claim 1, wherein said first wiring layer has a plurality of first wirings in said first region and a plurality of second wirings in said second region, each of said plurality of first wirings being arranged in line with a corresponding one of said plurality of second wirings.

3. The semiconductor memory device as claimed in claim 2, wherein said second wiring layer has a plurality of third wirings, which are arranged in a direction perpendicular to a border line between said first region and said second region, said plurality of third wirings electrically connecting said plurality of first wirings and said plurality of second wirings, respectively.

4. The semiconductor memory device as claimed in claim 3, wherein said first region comprises a memory cell array region and said second region comprises a peripheral circuit region.

5. The semiconductor memory device as claimed in claim 4, wherein said first wiring layer has a plurality of fourth wirings electrically connecting a plurality of word lines in said memory cell array region, respectively.

6. The semiconductor memory device as claimed in claim 5, wherein said second wiring layer has a plurality of bit lines, which are extended from said memory cell array region to said peripheral region in a direction perpendicular to said plurality of third wirings.

7. A semiconductor memory device comprising:
    a memory cell array region formed on a semiconductor substrate;

a peripheral circuit region formed on said semiconductor substrate;

a first interlayer insulating film formed on said memory cell array region and said peripheral circuit region and having a first step on a border portion between said memory cell array region and said peripheral circuit region;

a first wiring layer selectively formed on said first interlayer insulating film other than said border portion and including a first wiring on said memory cell array region and a second wiring on said peripheral circuit region;

a second interlayer insulating film formed on said first wiring layer; and a second wiring layer selectively formed on said second interlayer insulating film and having a third wiring on said border portion, said third wiring electrically connecting said first wiring to said second wiring.

8. The semiconductor memory device as claimed in claim 7, wherein said second interlayer insulating film has a second step on said border portion and said first step is higher than said second step.

9. The semiconductor memory device as claimed in claim 7, wherein said first wiring layer has wirings backing word lines of memory cell transistors formed in said memory cell array region and said second wiring layer has wirings constituting bit lines electrically connected to a plurality of source-drain diffusion layers of said memory cell transistors.

10. The semiconductor memory device as claimed in claim 9, wherein said first wiring layer has a plurality of contact dots for electrically connecting said bit lines to said plurality of source-drain diffusion layers, respectively.

11. The semiconductor memory device as claimed in claim 7, wherein each of memory cells provided in said memory cell array region comprises a non-volatile memory cell having a floating gate electrode and a control gate electrode.

12. The semiconductor device as claimed in claim 7, wherein first and second via-holes are formed over end portions of said first and second wirings in said first interlayer insulating film, respectively, and said third wiring is electrically connected to said first and second wirings through said first and second via-holes, respectively.

13. The semiconductor device as claimed in claim 11, wherein said wirings backing word lines and said control gate electrodes are electrically connected through a plurality of via-holes, respectively.

14. The semiconductor device as claimed in claim 7, wherein said first and second interlayer insulating films are flattened by chemical-mechanical polishing (CMP).

15. The semiconductor device as claimed in claim 9, wherein said bit lines stride across said border portion.

* * * * *